(12) United States Patent
Sunkavalli et al.

(10) Patent No.: US 9,047,975 B2
(45) Date of Patent: Jun. 2, 2015

(54) CODING TECHNIQUES FOR REDUCING WRITE CYCLES FOR MEMORY

(71) Applicant: ADESTO TECHNOLOGIES CORPORATION, Sunnyvale, CA (US)

(72) Inventors: Ravi Sunkavalli, Cupertino, CA (US); Malcolm Wing, Palo Alto, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 296 days.

(21) Appl. No.: 13/687,147

(22) Filed: Nov. 28, 2012

(65) Prior Publication Data

US 2014/0149639 A1    May 29, 2014

(51) Int. Cl.
*G06F 12/00* (2006.01)
*G06F 13/00* (2006.01)
(Continued)

(52) U.S. Cl.
CPC .......... *G11C 16/349* (2013.01); *G11C 16/3495* (2013.01); *H03M 13/23* (2013.01); *G06F 11/1048* (2013.01); *G06F 12/0238* (2013.01); *G11C 16/00* (2013.01); *G11C 11/5628* (2013.01); *G11C 7/1006* (2013.01); *G11C 11/5614* (2013.01); *G11C 11/5685* (2013.01); *G11C 13/0007* (2013.01); *G11C 13/0011* (2013.01); *G11C 13/0069* (2013.01); *G11C 2211/5647* (2013.01); *G11C 2211/5646* (2013.01); *G11C 2211/5648* (2013.01); *G11C 2211/5641* (2013.01)

(58) Field of Classification Search
CPC . G11C 16/3495; G06F 11/1048; H03M 13/23
USPC ................................................... 711/103, 154
See application file for complete search history.

(56) References Cited

U.S. PATENT DOCUMENTS 8,254,167 B2 *  8/2012  Patapoutian et al. .... 365/185.03
8,341,501 B2 * 12/2012  Franceschini et al. ........ 714/774
8,499,221 B2 *  7/2013  Franceschini et al. ........ 714/767

(Continued)

OTHER PUBLICATIONS

Jiang, Anxiao, Information Representation and Coding for Flash Memories, 2009 IEEE Pacific Rim Conference on Communications, Computers and Signal Processing, Aug. 24, 2009.

*Primary Examiner* — Ryan Bertram
(74) *Attorney, Agent, or Firm* — Michael C. Stephens, Jr.

(57) ABSTRACT

Structures and methods for encoding data to reduce write cycles in a semiconductor memory device are disclosed herein. In one embodiment, a method of writing data to a semiconductor memory device can include: (i) determining a number of significant bits for data to be written in the semiconductor memory device; (ii) determining a tag associated with the data to be written in the semiconductor memory device, where the tag is determined based on the determined number of significant bits; (iii) encoding the data when the tag has a first state, where the tag is configured to indicate data encoding that comprises using N bits of the encoded data to store M bits of the data, where M and N are both positive integers and N is greater than M; and (iv) writing the encoded data and the tag in the semiconductor memory device.

19 Claims, 13 Drawing Sheets

(51) Int. Cl.
*G06F 13/28* (2006.01)
*G11C 16/34* (2006.01)
*G06F 12/02* (2006.01)
*G11C 16/00* (2006.01)
*G11C 11/56* (2006.01)
*G11C 7/10* (2006.01)
*G11C 13/00* (2006.01)
*H03M 13/23* (2006.01)
*G06F 11/10* (2006.01)

(56) References Cited

U.S. PATENT DOCUMENTS

2004/0160343 A1* 8/2004 Sprouse .......................... 341/50
2007/0150644 A1* 6/2007 Pinto et al. ................... 711/103
2012/0096328 A1* 4/2012 Franceschini et al. ........ 714/758
2013/0145238 A1* 6/2013 Alhussien et al. ............ 714/786

* cited by examiner

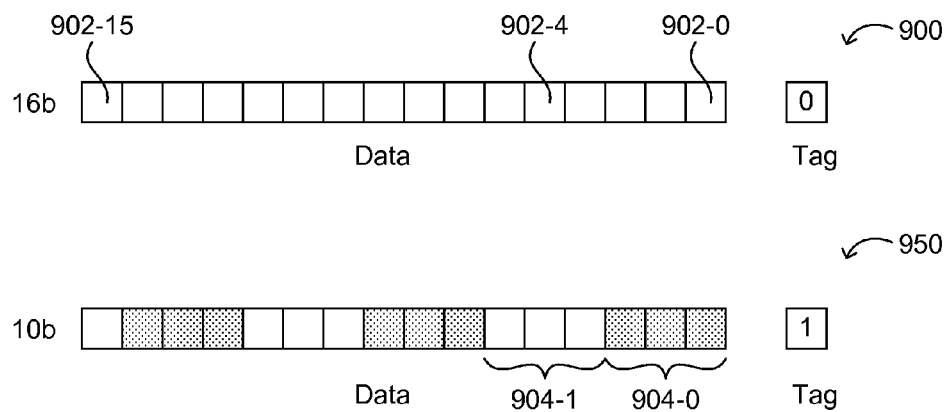
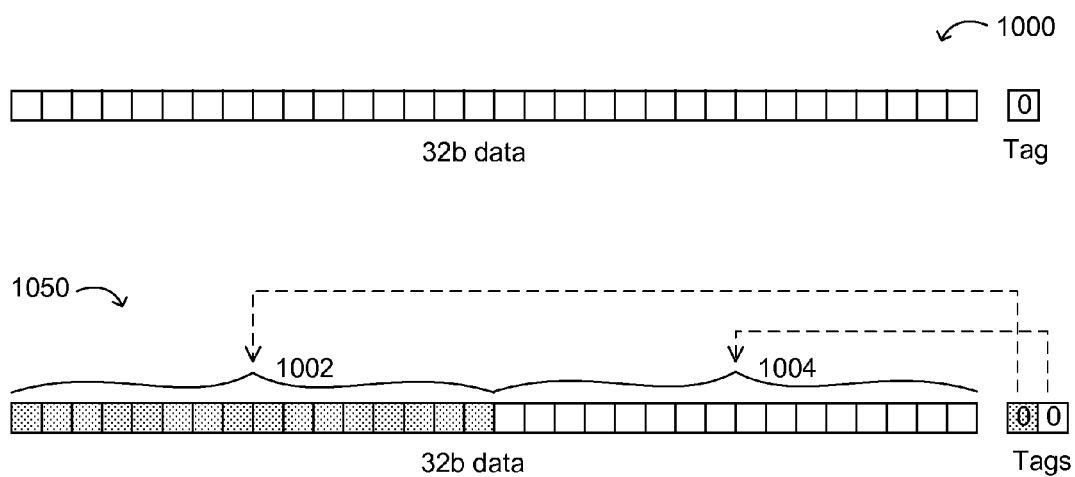
FIG. 9
FIG. 10

CODING TECHNIQUES FOR REDUCING WRITE CYCLES FOR MEMORY

FIELD OF THE INVENTION

The present invention generally relates to the field of semiconductor memory. More specifically, embodiments of the present invention pertain to techniques for reducing write cycles to memory.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high programming current, as well as physical degradation of the memory cell over time. Other NVM technologies, such as resistive RAM (ReRAM) and conductive bridging RAM (CBRAM), may offer relatively low power and higher speeds as compared to flash memory technologies. CBRAM utilizes a programmable metallization cell (PMC) technology, which has the potential to scale to smaller sizes than flash memory devices.

Due to rapidly growing numbers of compact, low-power, portable computer systems and handheld appliances in which stored information in the form of binary data changes regularly, low energy read/write semiconductor memories have become increasingly desirable and widespread. Furthermore, because these portable systems often require data storage when the power is turned off, NVM and devices may be desired for use in such systems.

SUMMARY

Embodiments of the present invention relate to encoding techniques for reducing write cycles for memory.

In one embodiment, a method of writing data to a semiconductor memory device, can include: (i) determining a number of significant bits for data to be written in the semiconductor memory device; (ii) determining a tag associated with the data to be written in the semiconductor memory device, where the tag is determined based on the determined number of significant bits; (iii) encoding the data when the tag has a first state, where the tag is configured to indicate data encoding that comprises using N bits of the encoded data to store M bits of the data, where M and N are both positive integers and N is greater than M; and (iv) writing the encoded data and the tag in the semiconductor memory device.

In one embodiment, a semiconductor memory device can include: (i) a plurality of memory cells configured to store encoded data and a tag; (ii) an encoder configured to encode the data prior to being stored in the plurality of memory cells based on a state of the tag, where the tag is configured to indicate data encoding that comprises using N bits of the encoded data to store M bits of data, where M and N are both positive integers and N is greater than M; (iii) write control circuitry configured to write the encoded data and the tag in the plurality of memory cells; (iv) read control circuitry configured to read the encoded data from the plurality of memory cells; and (v) decoder configured to decode the encoded data based on the tag.

Embodiments of the present invention can advantageously provide for a reduced write cycles relative to conventional approaches. Particular embodiments are suitable for memories that suffer from wear effects over time due to writing, such as resistive random-access memory (ReRAM) and/or conductive bridging RAM (CBRAM) memory cells. These and other advantages of the present invention will become readily apparent from the detailed description of preferred embodiments below.

BRIEF DESCRIPTION OF THE DRAWINGS

FIG. 9 is a diagram of example encoded and unencoded data storage based on tag state in accordance with embodiments of the present invention.

FIG. 10 is a diagram of example data storage for other word lengths in accordance with embodiments of the present invention.

DETAILED DESCRIPTION OF EMBODIMENTS

Figure 1:
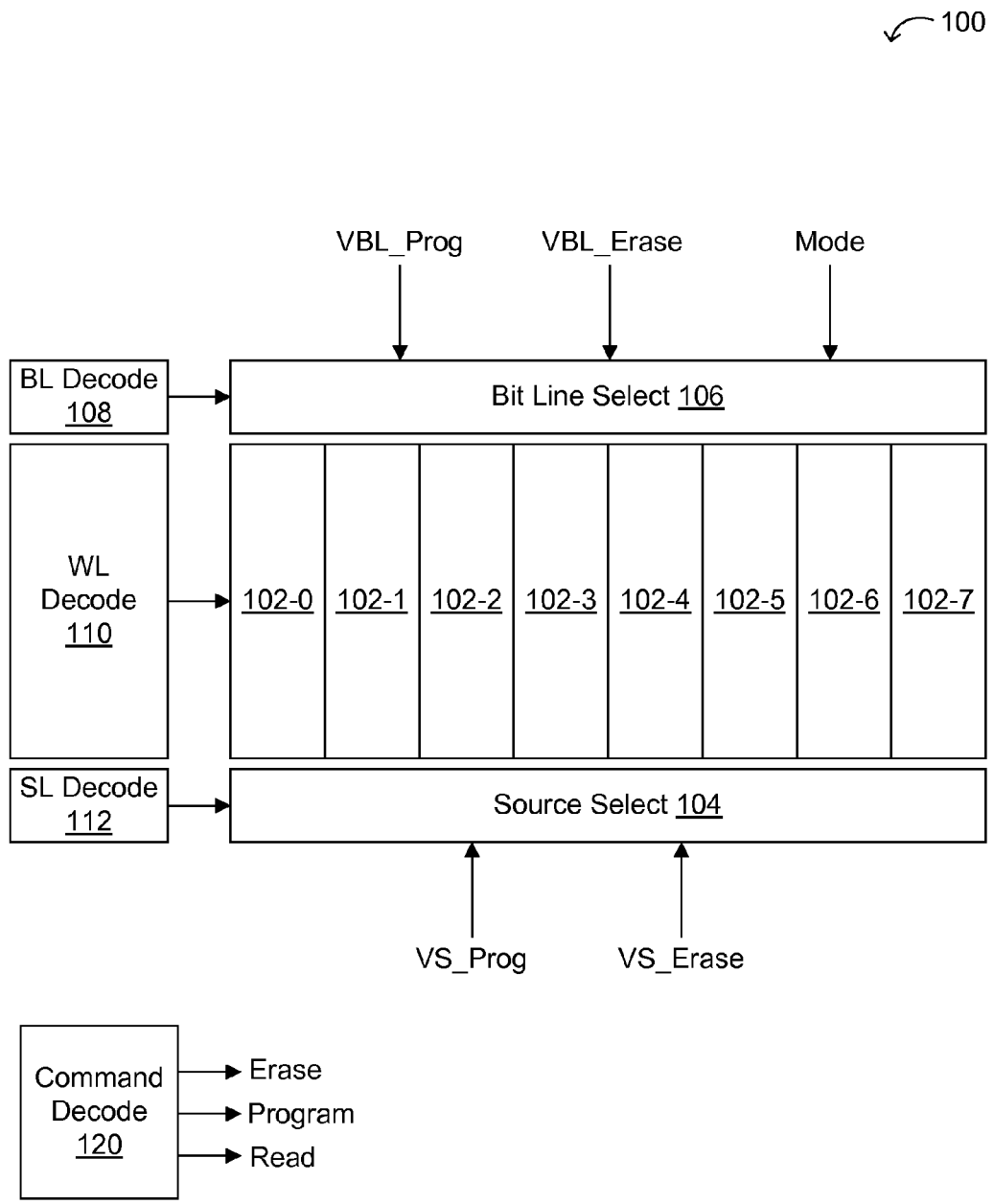
FIG. 1 is an example memory device arrangement.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Particular embodiments may be directed to programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of operating PMCs that can be programmed/written and erased between one or more resistance and/or capacitive states.

Figure 2:
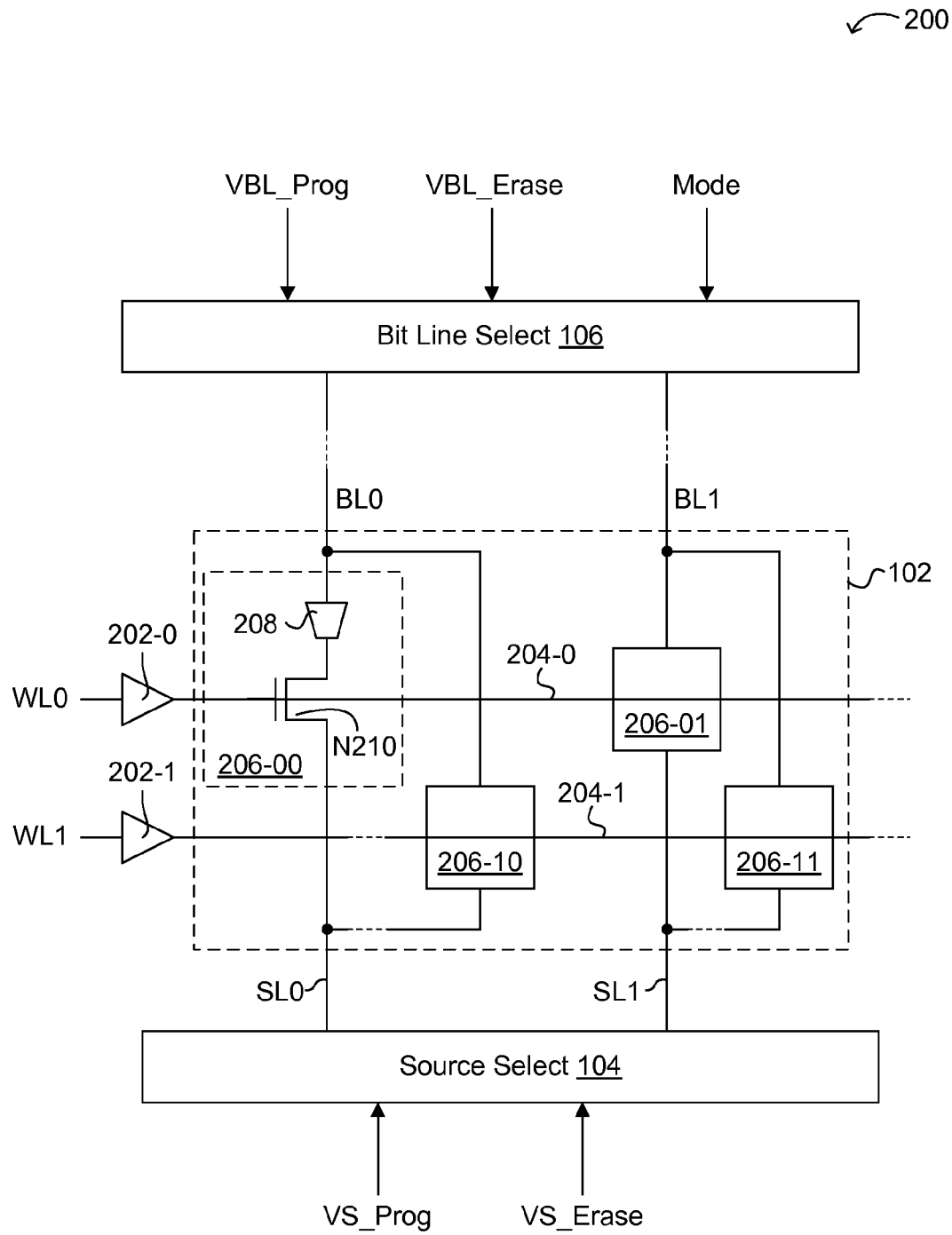
FIG. 2 is a diagram of an example memory device and memory cell structure.

FIGS. 1 and 2 show example memory architectures and circuit structures that can utilize PMCs of particular embodiments. However, PMCs of particular embodiments are suitable for use in a wide variety of memory architectures and circuit structures. In addition, particular embodiments are suitable to a wide variety of memory types, including both non-volatile memory (NVM), and in some cases volatile types of memory, in particular to memories that suffer from wear effects over time due to cell writing (e.g., programming or erasing). Thus, PMC represents only one particular example of a memory cell that can benefit from the coding techniques of certain embodiments.

Referring now to FIG. 1, an example memory device is shown and designated by the general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, recovery, etc.) in response. Such internal operation control signals can be used to generate various supply levels (e.g., particular program and erase voltage levels), as well as other control signals (e.g., recovery operation control signals), as will be discussed in more detail below. For example, a recovery command may be used to initiate recovery of data after a semiconductor memory device (e.g., including PMC-based memory cells) is mounted to a printed-circuit board (PCB). In this way, command decoding circuitry 120 may be used to determine an operation to be performed on the device.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, PMCs in particular embodiments are suitable for use in any type of PMC memory device architecture.

PMC sectors (102-0 to 102-7) may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be generated power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage generator (e.g., based on a reference voltage) of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1–V2) in an anode-to-cathode direction. In an erase operation, a PMC to be erased can be connected between suitable voltages (e.g., V2–V1) in an anode-to-cathode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be an erase voltage, which may both be a supply voltage (Vprog=V1−V2, Verase=V2−V1, Supply voltage=V2−V1). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 high to thereby select a memory cell 206, thus placing its corresponding access device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture. Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation, in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltages and/or currents to enable such access devices. In this way, bit line selection, source selection, and word line activation can be utilized to program and/or erase a PMC array having bit lines connected to anodes of PMCs within multiple memory cells.

While particular example architectures and circuits suitable for PMCs, and memory arrays formed thereof, with respect to FIGS. 1 and 2, programmable impedance elements in certain embodiments are suitable to a wide variety of architectures and/or circuit arrangements.

Figure 3:
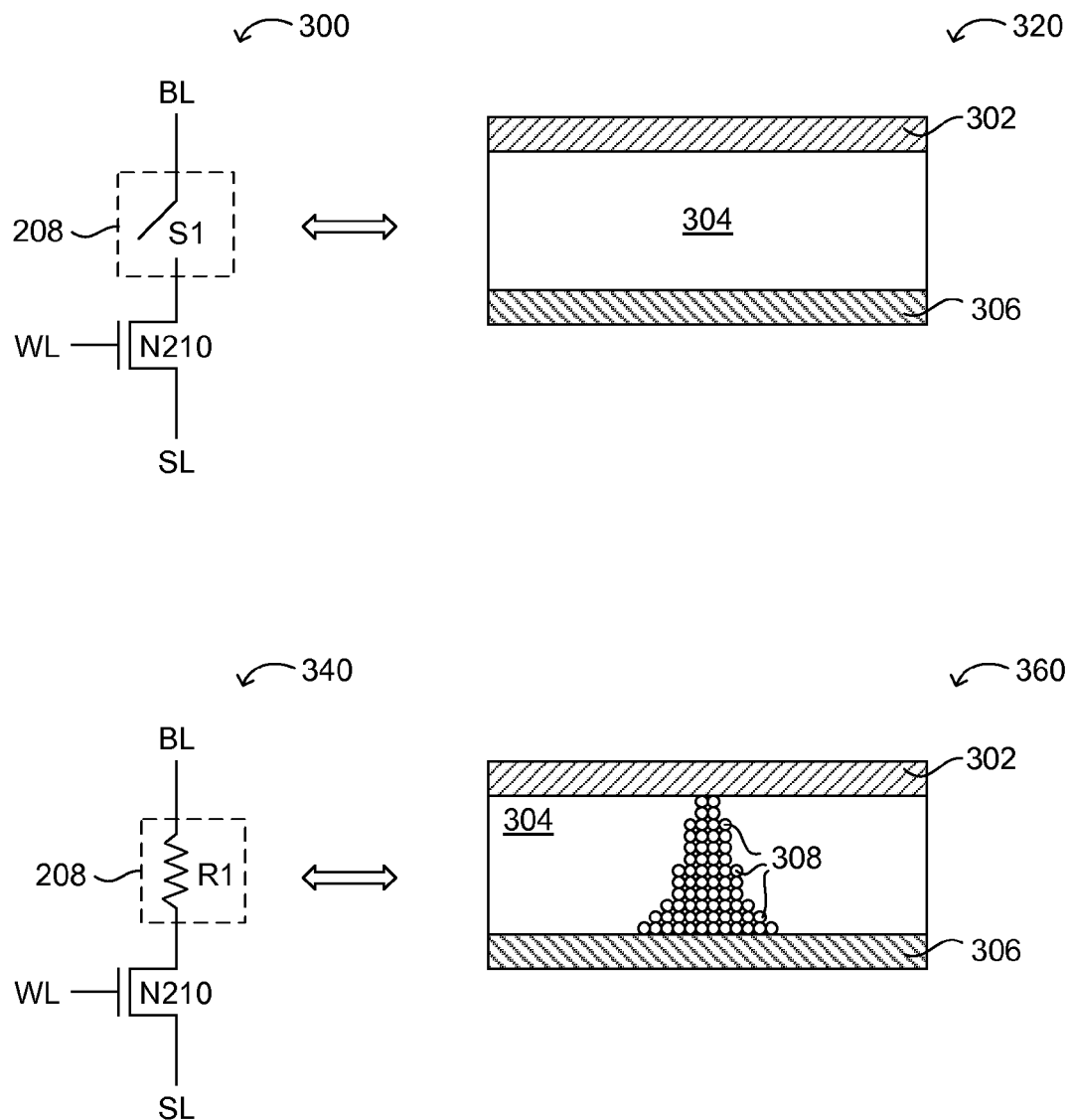
FIG. 3 is a diagram of an example programmable impedance element with schematic modeling.

Referring now to FIG. 3, shown is a diagram of an example programmable impedance element with corresponding schematic modeling. Example 300 shows a memory cell with an open switch 51 representation of PMC 208. The PMC portion of this representation corresponds to the cross-section diagram 320, which represents a PMC or programmable impedance element in a high impedance state (e.g., state "1"), or an erased state. Cross-section diagram 320 may also represent a "virgin" storage element state, whereby the PMC or programmable impedance element has not previously been effectively programmed. For example, a virgin storage element state may be one in which the memory cell has not been through a pre-conditioning or formation step where a formation voltage ($V_{FM}$) that is higher than a standard program voltage is used to initially program the cell. Partially dissolved or erased states may also be detected as a data state "1," or a multi-bit value, in some applications, and depending on the read-trip point. As used herein, "PMC" may be one example of a "programmable impedance element." In this example, PMC 320 can include electrochemically active electrode 302, solid electrolyte 304, and inert electrode 306.

Schematic representation 340 and corresponding cross-section diagram 360 show examples of PMC 208 in a low impedance state (e.g., state "0"), or a programmed state. Partial conductive paths may also be detected as a data state "0," or a multi-bit value, in some applications, and depending on the read-trip point. Example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in examples 300 and 340, a control transistor (e.g., N210) can also be included in each memory cell including the programmable impedance element or PMC 208. For example, transistor N210 can be controlled by a word line 204, as discussed above with respect to FIG. 2.

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes. As shown in the cross-section diagrams herein, however, the solid electrolyte layer is shown as thicker than the electrodes for illustration purposes.

Solid electrolyte 304 can include a chalcogenide compound, such as a germanium selenium (Ge—Se) compound. Solid electrolyte 304 can be formed by photodissolution of metal into a chalcogenide base glass. Chalcogenide materials are chemical compounds consisting of at least one chalcogen ion (a chemical element in column VI of the periodic table, also known as the oxygen family). More precisely, the term chalcogenide refers to the sulphides, selenides, and tellurides, PMCs may utilize the ionic conduction of compounds containing metallic ions.

Certain metals can be added to thin films of chalcogenide glasses by photodissolution. When Ag is combined in this fashion with Ge—Se or Ge—S glasses, the resulting ternary may contain a dispersed nanocrystalline $Ag_2S(e)$ phase that has relatively large quantities of mobile metal ions. The presence of these ions allows the ternaries to act as solid electrolytes. If an anode that has an oxidizable form of the ionic metal and an inert cathode are applied in contact with such a phase-separated electrolyte, an ion current of mobile elements (e.g., positively charged metal ions) can flow under an applied voltage bias, Electrons from the cathode can reduce the excess metal due to the ion flux and an electrodeposit (e.g., 308) forms on or in the electrolyte (e.g., 304). Also, other materials, such as certain oxides (e.g., tungsten oxide, hafnium oxide, nickel oxide, titanium oxide, transition metal oxides, etc.), can be used, as opposed to Ge—S and Ge—Se chalcogenide glasses. In addition, other metals, such as copper, can be used in place of silver, for the electrochemically active electrode that supplies mobile ions.

Various materials can be utilized to form electrodes 302 and 306. For example, inert electrode 306 can include tungsten, and electrochemically active electrode 302 can include silver or copper. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 μA). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "0" data value stored in that cell. However, if there is no nanowire or conductive path between electrodes in the cell (e.g., 320), the resistance is higher, leading to low current, and that can be read as a "1" data value stored in that cell. Of course, the definitions of "0" and "1" data values versus resistance levels can be reversed in some applications.

Cell data can be erased in similar fashion to cell writing or programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC can be substantially symmetric to a program or write operation.

Thus in conductive bridging random-access memory (CBRAM) applications, metal ions can dissolve readily in the material (e.g., 304) between the two electrodes (e.g., 302 and 306). In contrast, in resistive RAM (ReRAM) applications, the material between the electrodes may require a high electric field that can cause local damage in may produce a trail of conducting defects (a "filament"). Thus, for CBRAM, one electrode provides the dissolving ions, while for ReRAM, a one-time "forming" step may be required to generate the local damage.

However, many CBRAM/ReRAM devices, as well as other memory technologies (whether volatile or non-volatile), may have a limit on the number of write cycles (e.g., programming or erasing) allowed for reliable operation. Most of the data stored in memory is stored as words, and all bits in a word may not be written with the same frequency or number of occurrences. In particular embodiments, a total number of allowed writes can be increased due to the writes being spread over a larger portion or an entire word, instead of a small portion of more heavily used bits.

Example Coding Techniques for Reducing Write Cycles in Memory

In particular embodiments, a significance of data (e.g., significant bits within a data word) to be stored can be determined, and the data may be encoded in order to effectively spread out the writes more evenly across a larger portion or an entire write word. This is in contrast to conventional approaches that do not try to evaluate characteristics of the data to be stored, but rather operate on whatever data is coming in by attempting to optimize some aspect of the data in order to improve reliability (e.g., error correcting code [ECC], etc.), to reduce transition density, or the like. Certain embodiments are directed to reducing write cycles based on preliminary data characterization, by using encoding techniques and a tag to identify the particular encoding technique used on a particular piece of data.

In one embodiment, a method of writing data to a semiconductor memory device, can include: (i) determining a number of significant bits for data to be written in the semiconductor memory device; (ii) determining a tag associated with the data to be written in the semiconductor memory device, where the tag is determined based on the determined number of significant bits; (iii) encoding the data when the tag has a first state, where the tag is configured to indicate data encoding that includes using N bits of the encoded data to store M bits of the data, where M and N are both positive integers and N is greater than M; and (iv) writing the encoded data and the tag in the semiconductor memory device.

In one embodiment, a semiconductor memory device can include: (i) a plurality of memory cells configured to store encoded data and a tag; (ii) an encoder configured to encode the data prior to being stored in the plurality of memory cells based on a state of the tag, where the tag is configured to indicate data encoding that includes using N bits of the encoded data to store M bits of data, where M and N are both positive integers and N is greater than M; (iii) write control circuitry configured to write the encoded data and the tag in the plurality of memory cells; (iv) read control circuitry configured to read the encoded data from the plurality of memory cells; and (v) decoder configured to decode the encoded data based on the tag.

Figure 4:
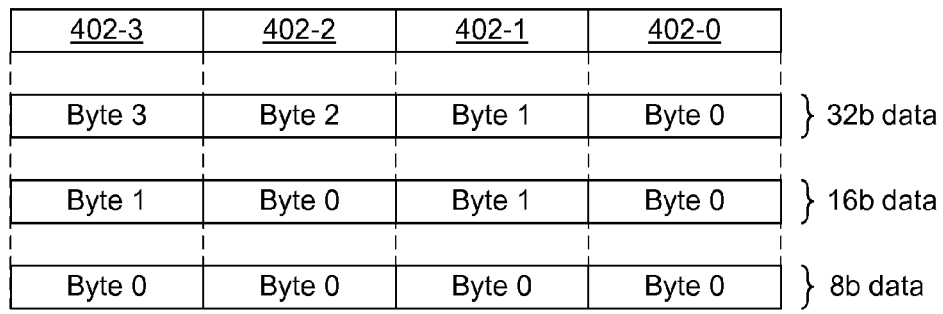
FIG. 4 is a diagram of example data alignment in memory.

Referring now to FIG. 4, shown is a diagram 400 of example data alignment in memory. Programs can use different lengths of storage or word sizes (e.g., 8b, 16b, 32b, etc.), and these sizes may be determined based on practical constraints of constructing an addressable memory, or other considerations. The data that is stored can have a range that fits in these sizes. For example, a byte can store 0 through 255 (unsigned), or −128 through +128 (signed). Of course, programs may use bit manipulation instructions to pack multiple data items into a single storage byte. However, such packing or compaction processes can incur a substantial performance overhead. Thus, while a system with substantial or tight storage limitations might perform such a compaction, most programs use natural storage sizes.

As shown in the example of FIG. 4, byte storage spaces 402 can store different data portions for different word lengths. For example, for an 8b data word, a byte 0 indicating a full word can be stored in each of byte storage spaces 402-0, 402-1, 402-2, and 402-3. For a 16b word, bytes 0 and 1 can form a word and may be stored in byte storage spaces 402-0, and 402-1, respectively, as well as bytes 0 and 1 of another 16b word being stored in byte storage spaces 402-2, and 402-3, respectively. For a 32b word, bytes 0, 1, 2, and 3 can be stored in byte storage spaces 402-0, 402-1, 402-2, and 402-3, respectively, to form the full word. Of course, the particular example of FIG. 4 represents only a few examples of word lengths and byte storage arrangements therein. However, particular embodiments are suitable to a wide variety of word lengths, byte storage arrangements, and data patterns.

Figure 5:
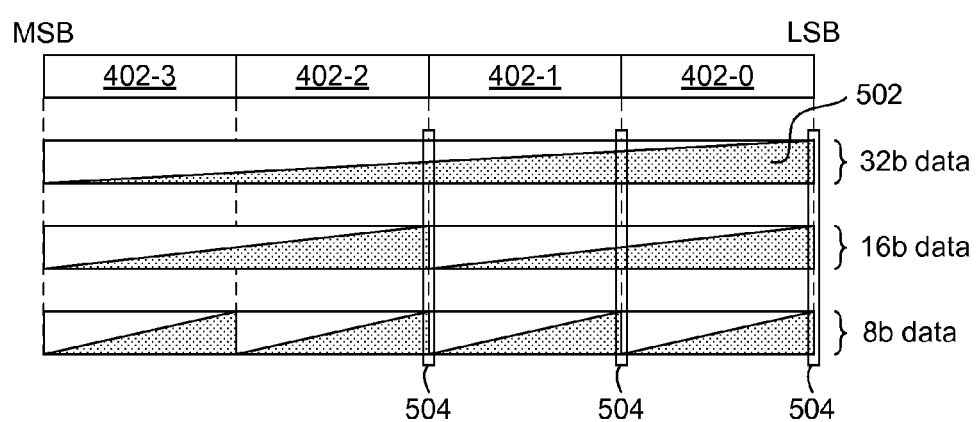
FIG. 5 is a diagram of an example distribution of active data bits.

Referring now to FIG. 5, shown is a diagram 500 of an example distribution of active data bits. Such "active" data bits can represent bit storage positions or memory cell locations that change frequently during a given application, program, or other usage. The shaded portions 502 represent the distributions of active data bits for a given word length. Such distributions can occur because, in many cases, only the least significant bits (LSBs) of the storage items are being changed. Thus, the LSBs tend to be more active than the most significant bits (MSBs) for a given data word. This is represented by the upward slope showing increasing distributions of active data bits as one moves from an MSB side to an LSB side of a data word.

In one example of a byte that is being used to store the day of the week (1-7) or the month of the year (1-12), many of the bits are essentially unused, and may be held in a "0" data state. For storing a day of the week (one of total days), only three LSBs are needed, while the remaining five bits remain unused. Similarly, for storing a month of the year (one of 12 total months), only for LSBs are needed, while the remaining four bits of the byte remain unused (held in a 0 data state). Thus in these examples, only the 3 or 4 LSBs may be changed, while the other bit positions in the byte remained substantially unchanged.

This skewed use of 8b, 16b and 32b (or other data word length) storage arrangements may have consequences in particular for a non-volatile memory. As seen in this example, relatively heavy wear portions 504 can occur toward the least significant ends of each 8b, 16b, and 32b storage words. As such, memory cells corresponding to heavy wear bit positions 504 may be among the first to fail due to excessive write (program and/or erase) operations, thus causing failure of the memory device. In examples of programmable impedance element-based cells, a conductive path or filament between electrodes may, e.g., fail to fully dissolve during an erase operation, or to fully form during a program operation, due to excessive wear or usage of that memory cell. Thus, program and erase resistances can vary with increased where, ultimately resulting in a failed data state (e.g., "1" or "0") of the memory cell.

In particular embodiments, such wear seen in FIG. 5 primarily on the LSBs may effectively be reduced by being spread out over more of the storage bit positions by using various encoding techniques. In this way, data that meets predetermined characteristics relative to significant bits can be encoded prior to storage in order to reduce a number of bit transitions per data write. Particular embodiments can effectively extend a data word by use of encoding techniques and a tag that indicates data length, and a code or encoding technique used. Thus, an identifying tag may be stored in association with the data so that the encoded data can be appropriately decoded upon a read from the semiconductor memory device.

In general, storing data may effectively utilize only a relatively small portion of the width of the data word. If a default state of a data word is all 0s, then much of the time in practical applications, data storage only effectively uses a few bits, such as the LSBs. Upper bits or MSBs may not change from cycle to cycle, as indicated in the example of FIG. 5. Non-volatile memory in particular can wear from the programming and erasing of write cycles to affect changes in such low order bits more often. Write once memory (WOM), such as CD-ROMs, may utilize encoding concepts in order to reduce a number of bit writes to the memory, but wear from repeated writes is not at issue since only a single write cycle to each stored cell is allowed. Further, such encoding approaches in WOM applications are not dynamically alterable. For example, particular embodiments allow for different encoding techniques to be employed and identified based on a dynamically stored tag that is associated with the encoded data.

Figure 6:
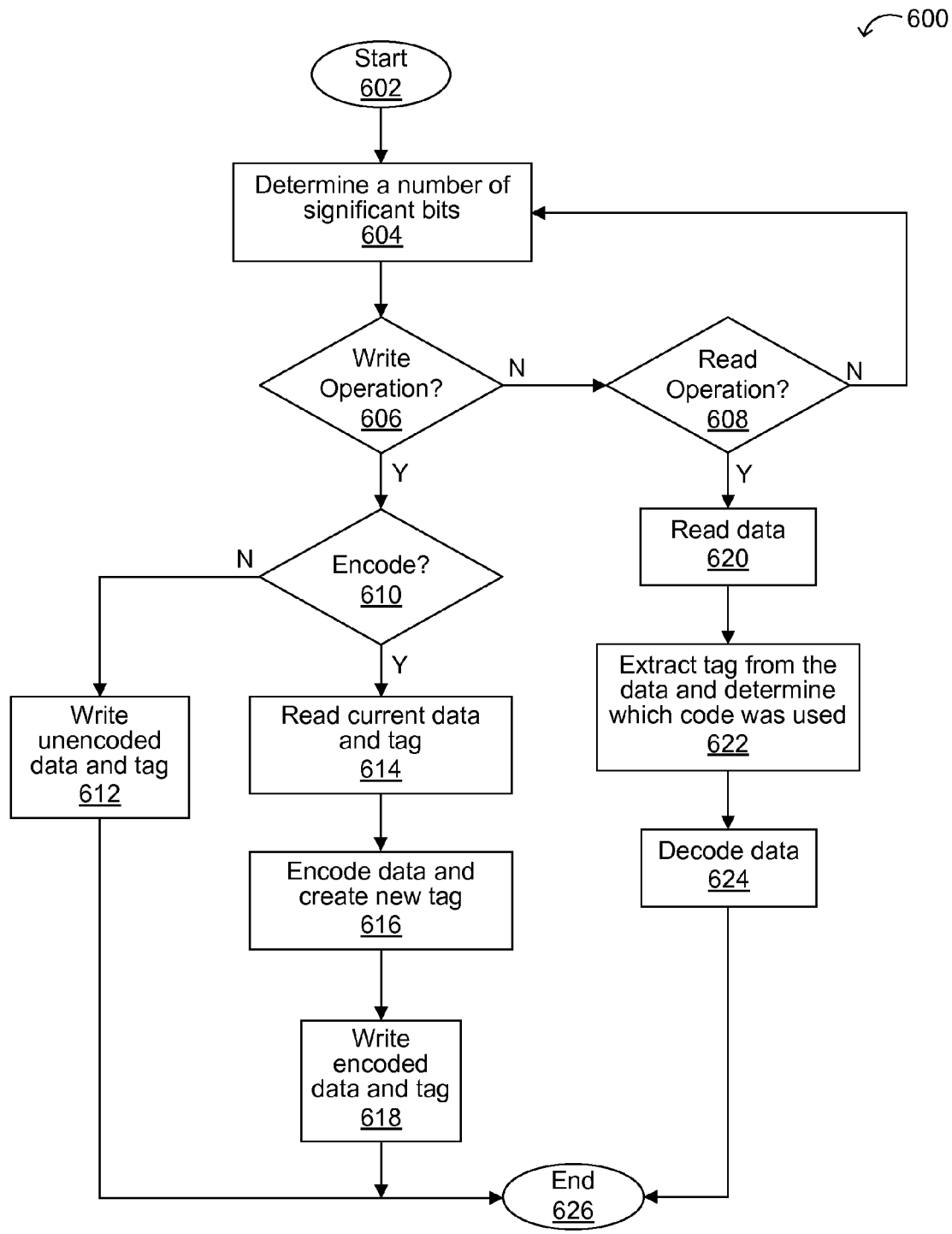
FIG. 6 is a flow diagram of example data read and write operations in accordance with embodiments of the present invention.

Referring now to FIG. 6, shown is a flow diagram 600 of example data read and write operations in accordance with embodiments of the present invention. The flow can begin 602, and at 604, a number of significant bits can be determined. The number of significant bits may be used as an indication of how many bits in a particular storage word are being used for a given application. This number of significant bits can be used to set a state of a tag to indicate writing of a particular range of bits, how many bits are written, as well as to identify a particular encoding technique to be used on that particular data word. In particular embodiments, such an encoding technique can effectively spread bit writes among the data word, and thus throughout memory for multiple data word storage. The tag may also indicate which bits are explicitly written, and also how many are not being written.

At 606, if the present operation is a write operation (e.g., determine via command decode 120), it can be determined whether data is to be encoded at 610. For example, this encoding determination can be based on the number of significant bits found in step 604. If the data is not to be encoded (610), unencoded data and tag (e.g., indicating that the data is unencoded) can be written at 612, completing the flow at 626. For example, the tag may remain unencoded because the bit significance determination may indicate that each bit in the given data word is used, or is likely to be used, for the given application. If the data is to be encoded, (610), current data and tag information can be read at 614. However, this step 614 can be skipped in some applications where it may not be necessary to know the previous data state at a given memory location. In some cases, step 614 may be utilized for read-modify-write applications, and may also help to reduce a number of write cycles by not having to, e.g., program memory cells that are already in the desired data state. For example, if the read operation at 614 indicates that many bits of the previously stored data word already match the data that is to be written, fewer bit positions would need to be written in the subsequent write cycle, thus also reducing wear on those memory cells. Step 614 may also be utilized whereby a same tag is applicable due to the nature of the previous data and the data to be written, such as were both have a same number of significant bits, and thus employed a same encoding technique. In this way, bit write, as well as tag generation can be simplified or reduced.

At 616, data may be encoded, and a new tag may be created. For example, the new data and tag may utilize old data, at least in part (see, e.g., Table 1 below). In some cases, the new tag may be the same as the current tag, such as when the same encoding technique is to be employed. For example, if the tag has a predetermined state (e.g., "1"), this may indicate that the read data has been encoded. In this case, the encoded data and tag can be written at 618, completing the flow at 626. However, if the tag has a different state (e.g., "0"), this may indicate that the read data has not been encoded and is thus in its natural state.

Of course, while this particular example indicates that data is either encoded or unencoded based on a single bit tag, multiple bit tags can also be used to indicate a variety of encoding techniques. For example, a two bit tag structure can indicate three different encoding techniques to go along with one unencoded data indication, a three bit tag structure can indicate seven different encoding techniques to go along with one unencoded indication, and so on. Thus, any number of tag bit structures can be employed in particular embodiments. Further, and as will be discussed below different portions (e.g., sub-words or bytes) of a data word can be mapped to their own tags. Thus, a single word may be mapped to a plurality of tags, and each such tag can contain one or more bits to identify encoding techniques (or an unencoded state) of the corresponding data portion.

In a read operation at 608, data can be read from a given memory location at 620. For example, the read operation can be determined by using command decode 120 (see, e.g., FIG. 1). At 622, the tag can be extracted to determine which type of encoding was used based on the tag. The tag may be extracted or parsed from the data, or can be read from a separate location or portion of the memory (e.g., PMC sectors 102). For example, if the tag value is "0," then the data accessed may be stored in its natural or unencoded state. However, if the tag value is "1," this may indicate that a given encoding technique was employed. Further, as discussed above, multiple bit tags can be utilized to distinguish from a plurality of predetermined encoding techniques that may be used.

At 624, the encoded data may be decoded, completing the flow at 626. In this way, the tag may be employed to determine an appropriate coding technique such that previously encoded data can be decoded in order to provide unencoded data from the device. Of course, if the data was not encoded to begin with (e.g., the tag value is "0"), then step 624 two decode the data can be bypassed. In any event, unencoded data can be provided in response to a read command. Alternatively, the data may be read out in its encoded state, and a separate chip or device may be utilized to perform decoding. In this case, the separate chip or device may also have access to a mapping or table whereby the tag indicates a particular encoding technique that was previously applied.

Various data flows can be employed in particular embodiments. For example, Table 1 below shows one particular data flow in order to accommodate example read and write operations as discussed herein. In an example write operation, a significance of the data (e.g., a determination of which code or encoding technique to use based on how many significant bits are found in the data) can be determined. Such encoding can then be performed prior to writing the data in the memory if the determined code (e.g., based significant data bits) is not equal to an unencoded indication.

TABLE 1

| READ | WRITE |
|---|---|
| Memread (tag, data) | Code = Significance (data) |
| Case tag of | If Code is not equal to "unencoded" then: |
| "code 1" READ = decode1 (data) | Memread (olddata, oldtag) |
| ... | Newdata, newtag = Encode (Code, olddata, oldtag, data) |
| ... | Else: |
| "unencoded" READ = data | Newdata, newtag = data, "unencoded" Memwrite (newdata, newtag) |

Figure 7:
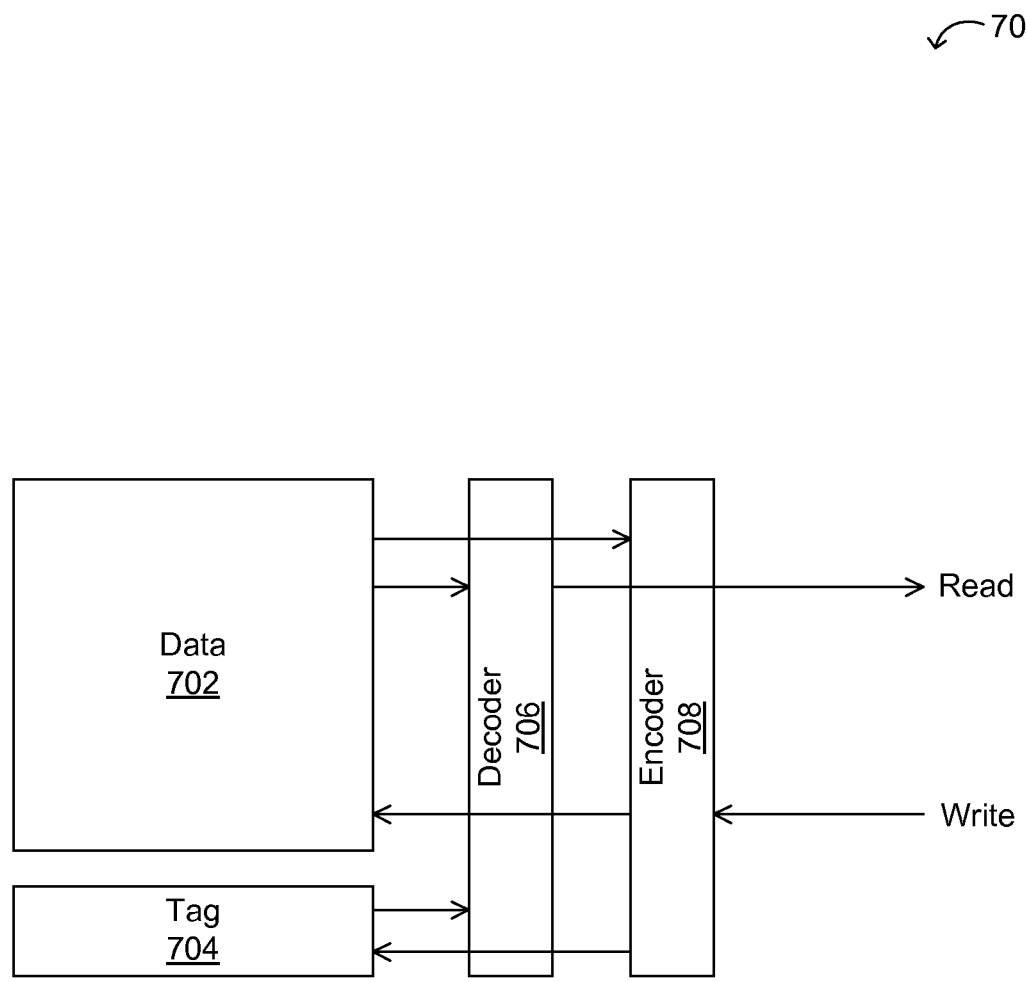
FIG. 7 is a block diagram of an example data and tag encoder and decoder arrangement, in accordance with embodiments of the present invention.

Referring now to FIG. 7, shown is a block diagram 700 of an example data and tag encoder and decoder arrangement, in accordance with embodiments of the present invention. In this example, data 702 and tag portion 704 can be stored in memory cells (e.g., PMC sectors 102). Such data 702 and tag 704 portions may be integrated in a same memory array or block (e.g., in a same memory row), or may be located in different portions of a semiconductor memory device.

As shown, decoder 706 and encoder 708 can be employed to perform decoding and encoding operations. For example, in a read operation, data can be accessed from data storage 702, and may then be decoded via decoder 706, to provide unencoded data at the readout. For a write operation, data may also be initially read (see, e.g., 610 in FIG. 6) to encoder 708, prior to new data being encoded at encoder 708 for writing to data storage 702. Further, tags can be read from tag storage 704 into decoder 706 so that an appropriate encoding technique can be determined in order to perform a decoding operation in decoder 706. Also, tags can be written to tag storage 704 from encoder 708, such as for a new or updated tag to indicate a particular encoding technique, or that no encoding technique is employed, corresponding to the particular data being written. Decoder 706 and encoder 708 can be any suitable types of circuits or implementations of logic functions in order to appropriately decode and/or encode data according to a predetermined encoding technique.

Figure 8:
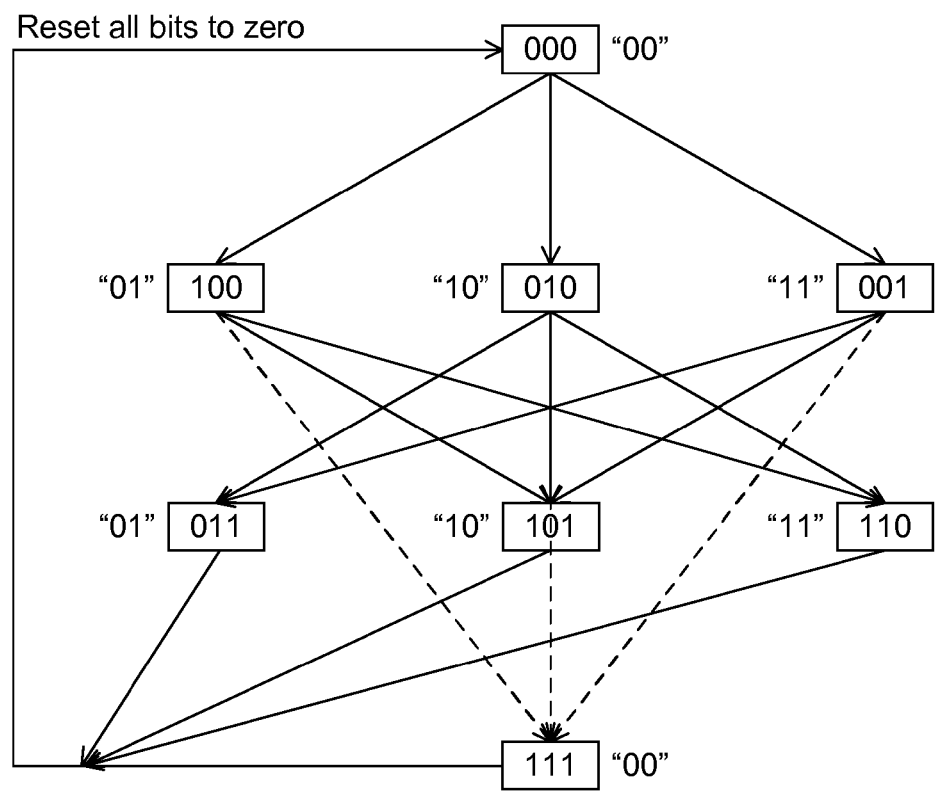
FIG. 8 is a diagram of example data conversion according to a Rivest/Shamir code.

Referring now to FIG. 8, shown is a diagram 800 of example data conversion according to a Rivest/Shamir code. CBRAMs are not write once types of memories, but by using such codes, the number of bit transitions, and therefore the amount of wear on memory cells therein, may be reduced. As shown, each solid arrow line, with the exception of the reset of all bits to zero, involves only one bit transition or flip. The dashed lines represent two bit transitions, and three bits may be flipped on the reset loop. As can be seen, an unencoded "00" state can be represented as either a 3-bit "000" or "111" encoded value. Further, transitions from an unencoded "00" state to, e.g., an unencoded "11" state, which require two bit transitions, can instead only utilize single bit transitions (e.g., from "000" to "001") when performed on encoded data. In this way, bit transitions, and thus bit write operations, can be reduced in order to reduce wear on corresponding memory cells.

Particular embodiments are suitable for all types of NVM, or any memory that encounters wear when memory cells therein are written to, which is typically NVM types of memory. When data is read from the semiconductor device, the tag may be read first, followed by the corresponding data. Alternatively, the tag and associated data may be read in parallel (e.g., from data storage 702 and tag storage 704) at substantially a same time. In any event, various coding techniques, such as use of 3-bits (e.g., "010") to store the value of 2-bits (e.g., "10"), as shown in the example of FIG. 8, may be utilized in order to allow writing with fewer bit transitions (e.g., only flip one bit for a given write data portion). Further, once a bit transition is made during a write operation, a subsequent write operation may also only change a single bit (e.g., at a different bit position, or the same bit position). Thus, each write operation can be performed with reduced bit state transitions, as compared to unencoded data storage approaches.

Referring now to FIG. 9, shown is a diagram of example encoded and unencoded data storage based on tag state in accordance with embodiments of the present invention. As shown in example 900, unencoded data indicated by a tag value of "0" may be natural or unencoded data written into bit positions 902 (e.g., 902-0, . . . , 902-4, . . . , 902-15). For example, the tag value of "0" may be used to indicate unencoded data, and may be so designated based on a number of significant bits (e.g., if data $>2^{X-1}$) in the data. Otherwise, a tag value of "1" may indicate encoded data, such as shown in example 950. In this case, a tag value of "1" may correspond to an encoding technique whereby each two bits of data are encoded into three bits of data (see, e.g., FIG. 8). Also, as discussed above, multiple bit tags can be employed to indicate selection of a particular encoding technique from a plurality of supported encoding techniques. Thus for example, different data on a same semiconductor memory device may be encoded using different encoding techniques.

Unencoded data shown in example 900 can be where all 16-bits are used, such as where each bit has significance, as opposed to only three bits of a byte having significance, as discussed in the day of the week storage example above. Alternatively, significant data can be encoded in a plurality of 3-bit chunks, such as five 3-bit chunks 904, (e.g., 904-0, 904-1, etc.). Other codes (e.g., as designated by multi-bit tags) are also possible to use N bits to represent M bits, where both N and M are positive integers, and N>M. In this way, significant data is encoded and spread over a larger portion of a data word. Thus, wear is spread over a larger portion, such as 10-bits of data being spread over 15-bits of encoded data. Further, each such 10-bits of data to be written may only flip or transition 5-bits, whereby one such transition may occur per pair of bits. In addition, smaller or different chunks of data can be employed, as well as other word lengths. Further, codes that require "generation" or other steps or mappings, may be stored in the tag. For example, a tag may indicate a pointer to a location that then supplies an operation that generates the corresponding encoding for the data.

Referring now to FIG. 10, shown is a diagram of example data storage for other word lengths in accordance with embodiments of the present invention. In example 1000, a 32b word of data may utilize a single tag bit as shown. For example, the 32b data word may be unencoded for a tag value of "0," while a tag value of "1" can indicate a predetermined encoding technique is applied to the corresponding data. However, in some applications such longer data words may be broken up into smaller portions corresponding to different tags.

Example 1050 shows a 32b word of data that employs different tags for different portions of the data word. For example, a shaded portion may indicate a tag that corresponds to data word portion 1002 (e.g., an upper word half), while the other tag bit may correspond to lower data word portion 1004. In addition, different data word portions may correspond to multi-bit tags instead of single bit tags. In this case, a multi-bit tag may correspond to upper data word portion 1002, and then another multi-bit tag may correspond to lower data word portion 1004. In this way, sub data word portions can have different encoding techniques applied thereto, and these may be identified by way of corresponding multi-bit tags. In one example, a hierarchy of tags can be employed, such as where a first tag level denotes an encoding scheme that minimizes a number of significant bits, and a second tag level reduces a number of writes or bit transitions.

In particular embodiments, code bits, data, and/or encoded data may be permuted, such as by changing bit positions within a data word. Also in particular embodiments, code bits, data, and/or encoded data may be inverted. Inverting may be utilized to invert each bit state (e.g., from a "1" to a "0," and vice versa) in a data word. This may facilitate the encoding decision based on significant bits after inversion, as well as the particular encoding technique or scheme chosen for the corresponding data word after inversion. Further, encoding can be combined with inversion and/or permutation in particular embodiments. Thus, data can be processed (e.g., inversion, permutation, etc.) along with being encoded by a particular encoding technique or scheme.

Figure 11:
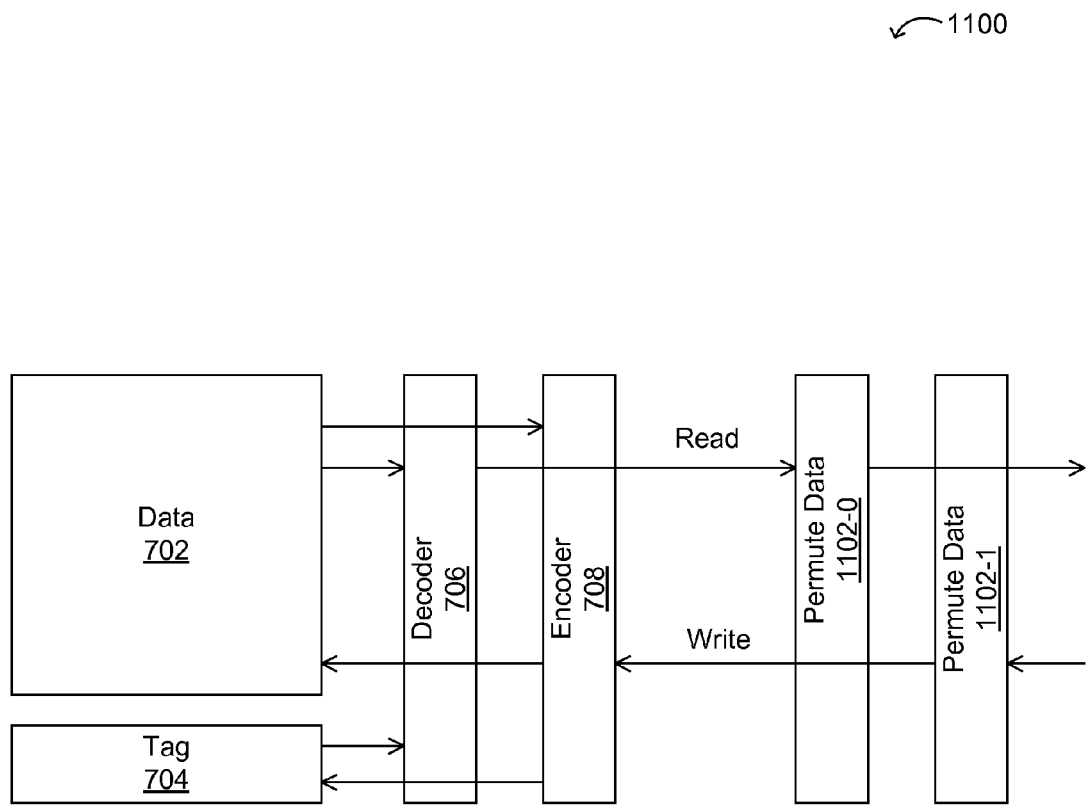
FIG. 11 is a block diagram of an example data and tag encoder and decoder arrangement with permutations, in accordance with embodiments of the present invention.

Referring now to FIG. 11, shown is a block diagram 1100 of an example data and tag encoder and decoder arrangement with permutations, in accordance with embodiments of the present invention. Permutation may be performed either before or after encoding, and may be indicated by permutation circuitry 1102 (e.g., 1102-0, 1102-1). Permutation may be particularly useful when the size of the data being written is larger than the code data size for a certain coding scheme. In permutation, the bit positions may be changed such that the data is distributed more evenly. Thus, permutation may also be used to facilitate reduction in the number of writes.

As shown, during a write cycle, data can be permuted by permutation circuitry 1102-1, and then encoded by encoder circuitry 708 prior to being written into data storage 702. Alternatively, data may be permuted after encoding. In addition, data that does not undergo encoding may also be permuted. During a read cycle, data can be permuted (e.g., to return bit data to their original bit positions) after being decoded by decoder circuitry 706. Alternatively, data may be permuted prior to encoded data being decoded. In addition, tags may also be permuted in some applications, such as when relatively long multi-bit tags are utilized.

Particular embodiments may utilize any suitable encoding technique or scheme, such as any of the codes described by Rivest/Shamir. In addition, encoding techniques can include position modulation codes, floating codes, trajectory codes, as well as any other suitable coding. Particular embodiments may also support protection of errors in the tags that identify particular encoding techniques. For example, parity and/or checking for legal values that are separated by a predetermined hamming distance may be employed for tag error protection.

Figure 12:
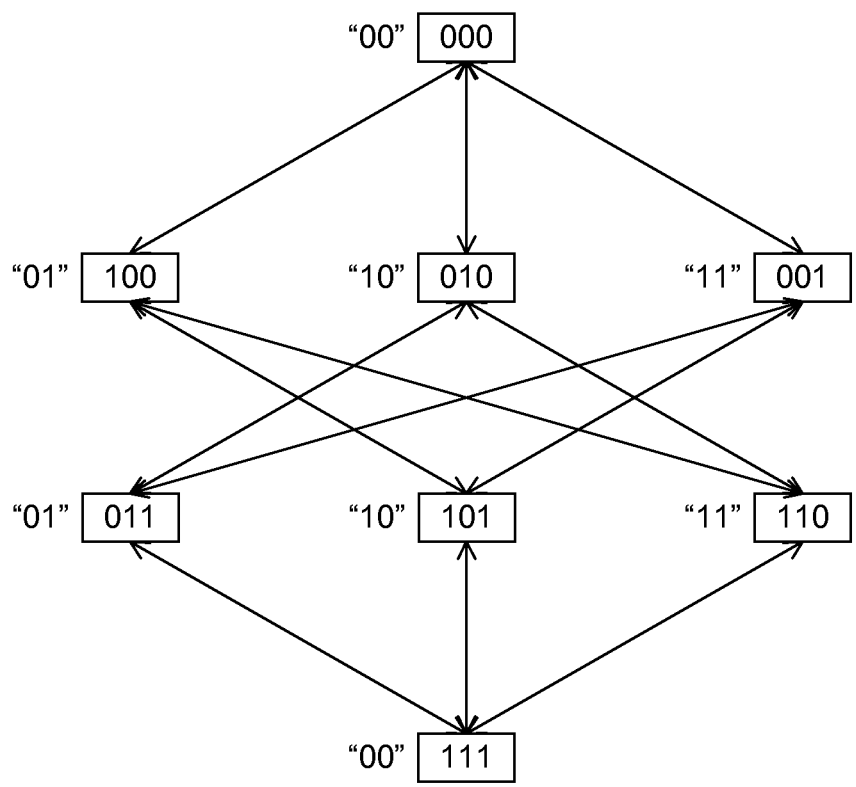
FIG. 12 is a diagram of example bidirectional data conversion for writing data, in accordance with embodiments of the present invention.

Referring now to FIG. 12, shown is a diagram 1200 of example bidirectional data conversion for writing data, in accordance with embodiments of the present invention. In this example, data for each 2-bit write cycle can be encoded such that only a single bit write in a 3-bit portion of encoded data need occur. In this example, only a single bit transitions may be allowed. Thus, "00" may be encoded as "000" and a transition to "11" (unencoded) can be made by flipping a single bit too "001" (encoded). Similarly, a transition from unencoded data "10" to "01" can occur by a single bit transition of corresponding encoded data "010" to "011" as shown.

Figure 13:
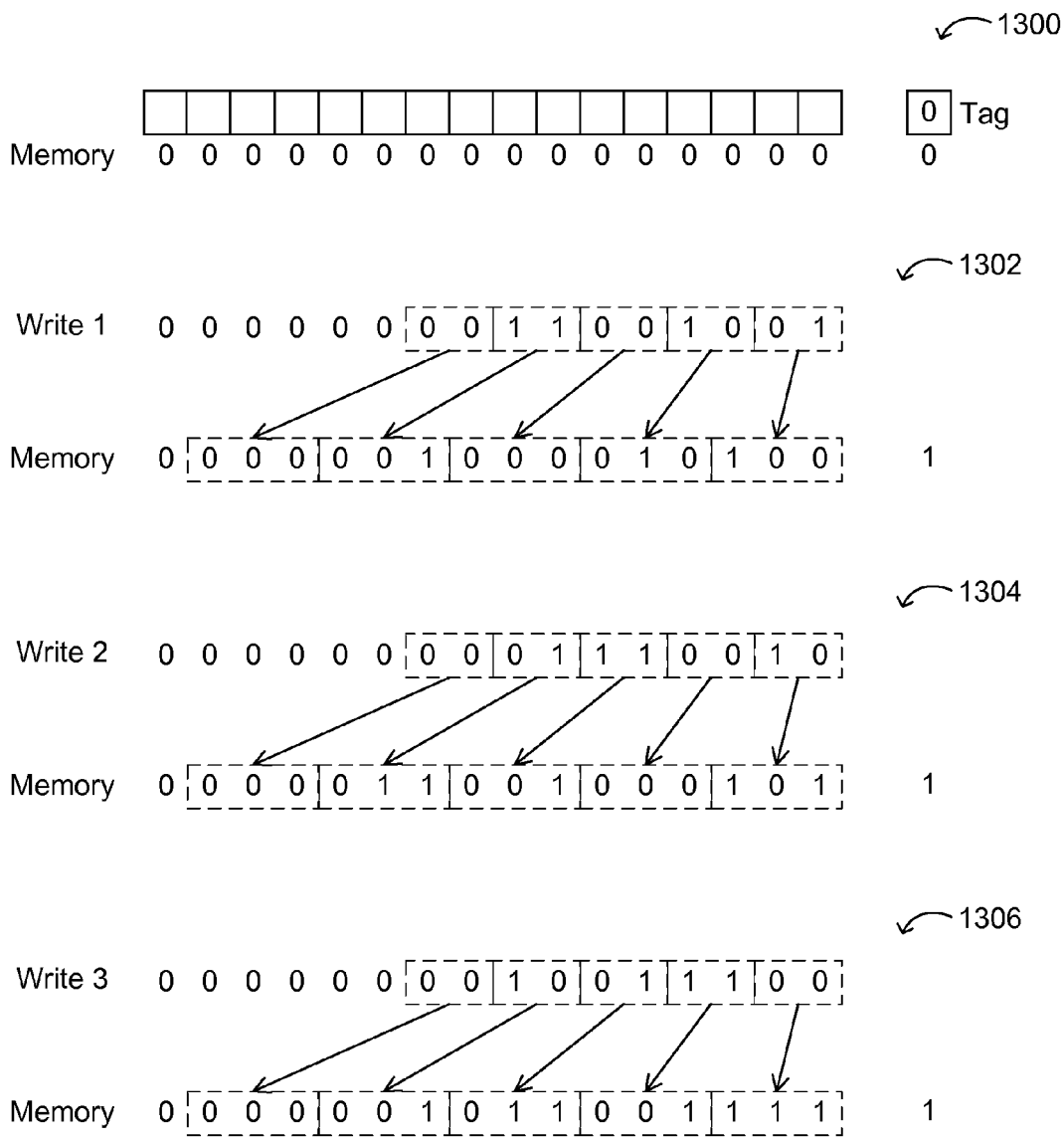
FIG. 13 is a diagram of example encoded data storage for various data states, in accordance with embodiments of the present invention.

Referring now to FIG. 13, shown is a diagram of example encoded data storage for various data states, in accordance with embodiments of the present invention. In 1300, shown are memory bit positions corresponding to a given tag value. In example 1302, 10 LSBs "0011001001" may be encoded into 15 bits "000001000010100" as shown in Write 1. Similarly, example 1304 shows an encoding from "0001110010" into "000011001000101" for Write 2, and example 1306 shows an encoding from "0010011100" into "000001011001111" encoded data for Write 3. As shown, each two 2-bit portion of significant unencoded data can be encoded (e.g., by using a conversion as shown in FIG. 12) into a corresponding 3-bit portion of encoded data. Of course, other conversion algorithms or encoding techniques, as well as different some word bit portions (e.g., 4, 5, 6, a byte, etc.) to which they are applied, can be accommodated in particular embodiments.

Figure 14:
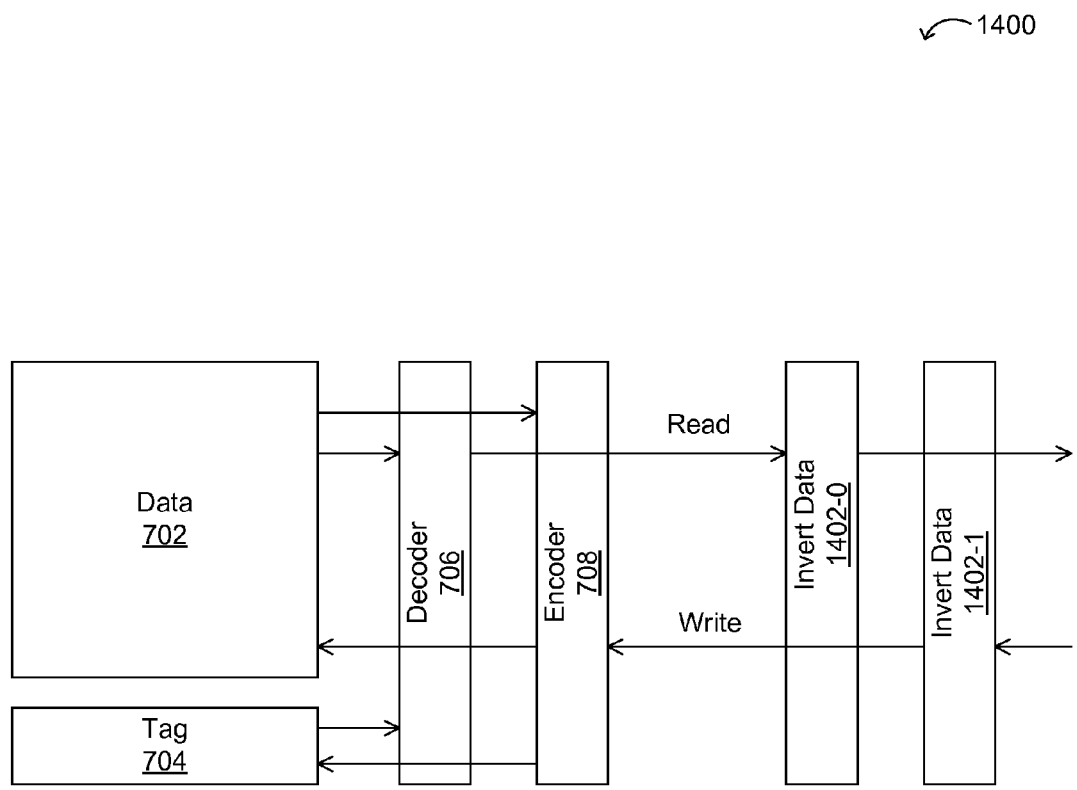
FIG. 14 is a block diagram of an example data and tag encoder and decoder arrangement with data inversions, in accordance with embodiments of the present invention.

Referring now to FIG. 14, shown is a block diagram 1400 of an example data and tag encoder and decoder arrangement with data inversions, in accordance with embodiments of the present invention. In this example, inversion circuitry 1402 (e.g., 1402-0, 1402-1) can be utilized to invert the data, either before or after encoding. Inversion may be profitable when the quantity or data number being stored is signed, such as where relatively small negative numbers many leading ones. As shown, during a write cycle, data can be inverted by inversion circuitry 1402-1, and then encoded by encoder circuitry 708 prior to being written into data storage 702. Alternatively, data may be inverted after encoding, and data that does not undergo encoding may also be inverted. During a read cycle, data can be inverted 1402-0 (e.g., to return bit data to its original state) after being decoded by decoder circuitry 706. Alternatively, data may be inverted prior to encoded data being decoded. In addition, tags may also be inverted in some applications, such as when relatively long multi-bit tags are utilized.

Figure 15:
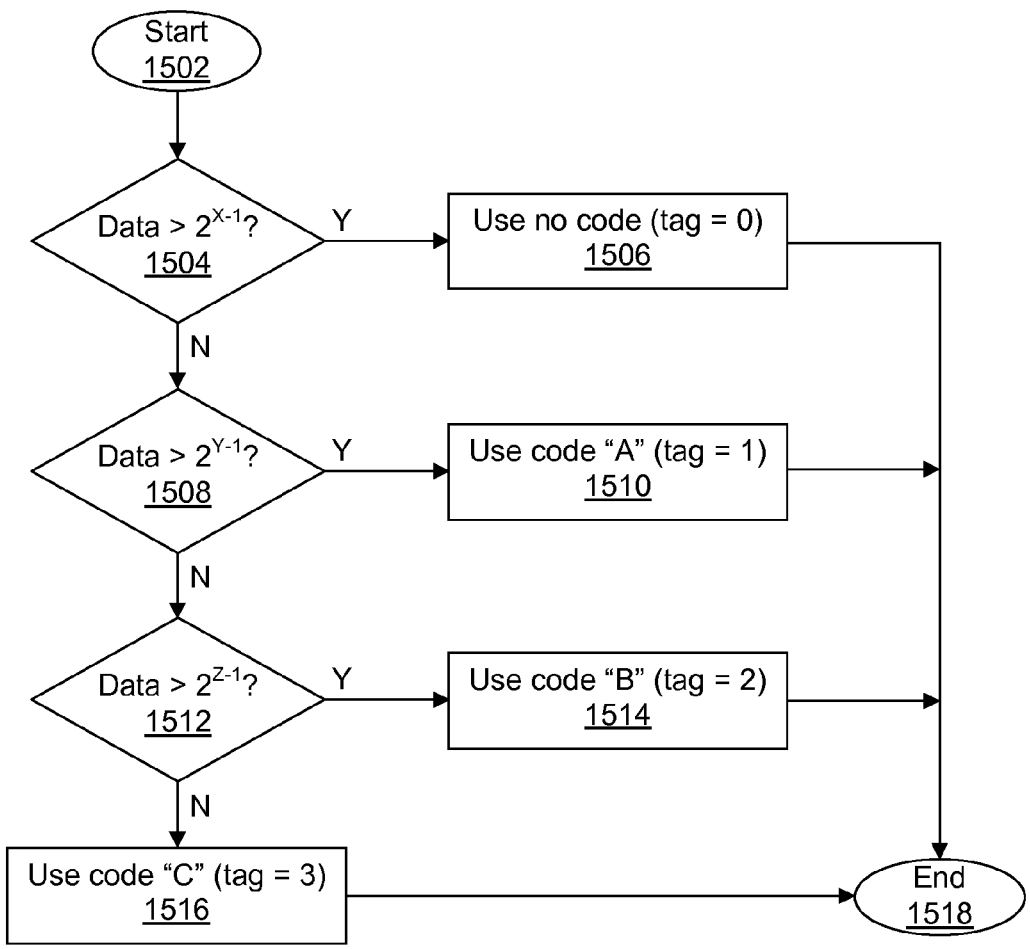
FIG. 15 is a flow diagram of example significant data determination in accordance with embodiments of the present invention.

Referring now to FIG. 15, shown is a flow diagram 1500 of example significant data determination in accordance with embodiments of the present invention. In this example, different encoding schemes can be chosen based on significant bits in the data to be stored. As discussed above, such different encoding schemes can be represented by a multi-bit tag. The flow begins at 1502, and at 1504 it may be determined if the data $>2^{X-1}$. As shown, X, Y, and Z may be positive integers with the relation X>Y>Z. If the data $>2^{X-1}$, then no encoding may be employed, and the tag may be set to a value of "0" at 1506. However, if the data $>2^{Y-1}$, then code "A" may be employed, and the tag may be set to a value of "1" to so indicate at 1510. However, if the data $>2^{Z-1}$, then code "B" may be employed, and the tag may be set to a value of "2" to so indicate at 1514. However, if the data is not greater than any of $2^{X-1}$, $2^{Y-1}$, or $2^{Z-1}$, then code "C" may be employed, and the tag may be set to a value of "3" to so indicate at 1516, completing the flow at 1518. In this way, one of a plurality of possible encoding schemes can be chosen based on data significance. Further, the selected encoding technique can be represented by corresponding tag bits.

It is also noted that, while only two storage states (state "0" and state "1") have been significantly described herein, PMCs may also each support more than one memory state. For example, depending on the voltage level controls, instead of a full erase or a full program/write, partial operations (e.g., by applying less/predetermined voltages for forward bias and reverse bias of the PMC) can be performed. Such partial operations can produce different resistance values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance and bias voltage characteristics.

While the above examples include circuit and structural implementations of certain memory cells and programmable impedance devices, one skilled in the art will recognize that other technologies, methods, and/or cell structures can be used in accordance with various embodiments. Further, one skilled in the art will recognize that other device circuit arrangements, architectures, elements, and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of writing data to a semiconductor memory device, the method comprising:
   a) determining a number of significant bits for data to be written in the semiconductor memory device;
   b) determining a tag associated with the data to be written in the semiconductor memory device, wherein the tag is determined based on the determined number of significant bits;
   c) encoding the data when the tag has a first state, wherein the tag is configured to indicate data encoding that comprises using N bits of the encoded data to store M bits of the data, wherein M and N are both positive integers and N is greater than M; and
   d) writing the encoded data and the tag in the semiconductor memory device.

2. The method of claim 1, further comprising reading current data and a current tag from a memory location prior to the determining the tag.

3. The method of claim 1, wherein the determining the number of significant bits comprises at least one of:
   a) determining if the data is greater than $2^{X-1}$;
   b) determining if the data is greater than $2^{Y-1}$; and
   c) determining if the data is greater than $2^{Z-1}$, wherein X, Y, and Z are positive integers, wherein X is greater than Y, and Y is greater than Z.

4. The method of claim 3, wherein the determining the tag comprises:
   a) setting the tag to a first state that indicates no encoding if the data is determined to be greater than $2^{X-1}$;
   b) otherwise setting the tag to a second state that indicates a first encoding if the data is determined to be greater than $2^{Y-1}$;
   c) otherwise setting the tag to a third state that indicates a second encoding if the data is determined to be greater than $2^{Z-1}$; and
   d) otherwise setting the tag to a fourth state that indicates a third encoding.

5. The method of claim 1, further comprising permuting the data.

6. The method of claim 1, further comprising inverting the data.

7. The method of claim 1, wherein N is 3 and M is 2.

8. The method of claim 1, wherein the writing the encoded data and the tag comprises writing to a plurality of memory cells, wherein each of the memory cells comprises:
   a) a programmable impedance element having an active electrode coupled to a bit line; and
   b) a transistor having a drain coupled to the inert electrode of the programmable impedance element, a gate coupled to a word line, and a source coupled to a source line.

9. The method of claim 8, wherein the programmable impedance element comprises:
   a) an inert electrode coupled to a first side of a solid electrolyte;
   b) an active electrode coupled to a second side of the solid electrolyte, wherein the programmable impedance element is programmed by formation of a conductive path between the active and inert electrodes; and
   c) a plurality of mobile elements derived from the active electrode, wherein the plurality of mobile elements are reduced in the solid electrolyte to form the conductive path.

10. The method of claim 9, wherein:
    a) the conductive path in the programmable impedance element is formed by application of a first voltage across the active and inert electrodes, the conductive path substantially remaining once formed after the first voltage is removed; and
    b) at least a portion of the conductive path is dissolved to erase the programmable impedance element by application of a second voltage across the active and inert electrodes.

11. The method of claim 1, further comprising:
    a) reading the encoded data from the semiconductor memory device;
    b) extracting the tag from the encoded data; and
    c) determining the data by decoding the encoded data using information about the encoding from the tag.

12. A semiconductor memory device, comprising:
a) a plurality of memory cells configured to store encoded data and a tag;
b) an encoder configured to encode the data prior to being stored in the plurality of memory cells based on a state of the tag, wherein the tag is configured to indicate data encoding that comprises using N bits of the encoded data to store M bits of data, wherein M and N are both positive integers and N is greater than M, and wherein the encoder is configured to determine a number of significant bits for data to be written in the semiconductor memory device, and to determine the tag based on the determined number of significant bits;
c) write control circuitry configured to write the encoded data and the tag in the plurality of memory cells;
d) read control circuitry configured to read the encoded data from the plurality of memory cells; and
e) a decoder configured to decode the encoded data based on the tag.

13. The semiconductor memory device of claim 12, further comprising permutation circuitry coupled to the encoder and the decoder, wherein the permutation circuitry is configured to permute the data.

14. The semiconductor memory device of claim 12, further comprising inversion circuitry coupled to the encoder and the decoder, wherein the inversion circuitry is configured to invert the data.

15. The semiconductor memory device of claim 12, wherein N is 3 and M is 2.

16. The semiconductor memory device of claim 12, wherein each of the plurality of memory cells comprises:
a) a programmable impedance element having an active electrode coupled to a bit line; and
b) a transistor having a drain coupled to the inert electrode of the programmable impedance element, a gate coupled to a word line, and a source coupled to a source line.

17. The semiconductor memory device of claim 16, wherein the programmable impedance element comprises:

a) an inert electrode coupled to a first side of a solid electrolyte;
b) an active electrode coupled to a second side of the solid electrolyte, wherein the programmable impedance element is programmed by formation of a conductive path between the active and inert electrodes; and
c) a plurality of mobile elements derived from the active electrode, wherein the plurality of mobile elements are reduced in the solid electrolyte to form the conductive path.

18. The semiconductor memory device of claim 17, wherein:
a) the conductive path in the programmable impedance element is formed by application of a first voltage across the active and inert electrodes, the conductive path substantially remaining once formed after the first voltage is removed; and
b) at least a portion of the conductive path is dissolved to erase the programmable impedance element by application of a second voltage across the active and inert electrodes.

19. An apparatus for writing data to a semiconductor memory device, the apparatus comprising:
a) means for determining a number of significant bits for data to be written in the semiconductor memory device;
b) means for determining a tag associated with the data to be written in the semiconductor memory device, wherein the tag is determined based on the determined number of significant bits;
c) means for encoding the data when the tag has a first state, wherein the tag is configured to indicate data encoding that comprises using N bits of the encoded data to store M bits of the data, wherein M and N are both positive integers and N is greater than M; and
d) means for writing the encoded data and the tag in the semiconductor memory device.

* * * * *